US008609544B2

(12) United States Patent
Lee

(10) Patent No.: US 8,609,544 B2
(45) Date of Patent: Dec. 17, 2013

(54) METHOD FOR FABRICATING SEMICONDUCTOR DEVICE

(75) Inventor: Sung Koo Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 188 days.

(21) Appl. No.: 13/336,238

(22) Filed: Dec. 23, 2011

(65) Prior Publication Data
US 2012/0244713 A1 Sep. 27, 2012

(30) Foreign Application Priority Data

Mar. 23, 2011 (KR) .................. 10-2011-0025981

(51) Int. Cl.
*H01L 21/311* (2006.01)

(52) U.S. Cl.
USPC .................... 438/703; 257/E21.249

(58) Field of Classification Search
USPC .................... 257/E21.249; 438/703
See application file for complete search history.

*Primary Examiner* — Marvin Payen
(74) *Attorney, Agent, or Firm* — IP & T Group LLP

(57) ABSTRACT

A method for fabricating a semiconductor device, comprising forming a first photoresist pattern having a hole on a first layer, forming a surface curing layer in the hole and curing the first photoresist pattern on an inner sidewall of the hole to form a first curing pattern, removing the surface curing layer, forming a second photoresist pattern in the hole and curing the second photoresist pattern that contacts with the first curing pattern to form a second curing pattern, removing the first and second photoresist patterns, and etching the first layer using the first and second curing patterns as an etch barrier.

15 Claims, 4 Drawing Sheets

METHOD FOR FABRICATING SEMICONDUCTOR DEVICE

CROSS-REFERENCE TO RELATED APPLICATIONS

The present application claims priority of Korean Patent Application No. 10-2011-0025981, filed on Mar. 23, 2011, which is incorporated herein by reference in its entirety.

BACKGROUND

1. Field

Exemplary embodiments of the present invention relate to a method for fabricating a semiconductor device, and more particularly, to a method for fabricating a semiconductor device that has simplified processes.

2. Description of the Related Art

Semiconductor devices may be a memory device to store data. Semiconductor devices may be used to store data in computers, cellular phones, broadcasting devices, education and entertainment devices, and the like.

The circuit area of a semiconductor device is increased in proportion to an increase in memory capacity. However, the area of a memory cell region related to the memory capacity is decreased. Therefore, to secure a designated memory capacity, a larger number of patterns are to be formed in a limited memory cell region, and accordingly, the critical dimension of the pattern becomes fine. To form patterns with a fine critical dimension, a lithography process may be developed.

The lithography process refers to a process of coating a photoresist material on a substrate and forming a photoresist pattern for defining a fine pattern through exposure and development. In the lithography process, a resolution R is determined according to the wavelength λ and numerical aperture (NA) of a light source, i.e., R=k1×λ/NA. In this formula, k1 denotes a process constant. Since k1 has a physical limitation, the value of k1 using a general method may not be decreased. Since a photoresist material having high reactivity for a short wavelength is to be developed together with an exposure device that uses the short wavelength, a fine pattern having a critical dimension less than the short wavelength may be difficult to form. Accordingly, a double patterning technology where patterns are doubly overlapped in consideration of a process ability of the exposure device may be implemented, and fine patterns may be formed without a change in exposure device or exposure condition. Further, a spacer patterning technology may be implemented, which is similar to the double patterning technology but has simplified processes because double exposure and double patterning are not included in the spacer patterning technology. However, since the spacer patterning technology has complicated processes such as a process of forming a photoresist pattern, a process of forming a spacer, and a process of removing the photoresist pattern, these processes are to be improved.

SUMMARY

An embodiment of the present invention is directed to a method for fabricating a semiconductor device, which has low cost and simplified processes.

In accordance with an embodiment of the present invention, a method for fabricating a semiconductor device includes forming a first photoresist pattern having a hole on a first layer; forming a surface curing layer in the hole and curing the first photoresist pattern on an inner sidewall of the hole to form a first curing pattern; removing the surface curing layer; forming a second photoresist pattern in the hole and curing the second photoresist pattern that contacts with the first curing pattern to form a second curing pattern; removing the first and second photoresist patterns; and etching the first layer using the first and second curing patterns as an etch barrier.

DETAILED DESCRIPTION

Figure 1A:
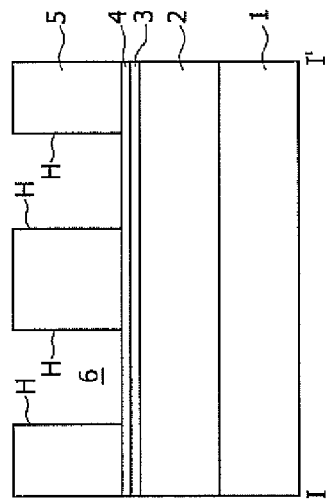
FIGS. 1a to 1f illustrate plan views of a semiconductor device and sectional views taken along a line I-I' of the semiconductor device, which illustrate a method for fabricating the semiconductor device in accordance with an embodiment of the present invention.
Figure 1A:
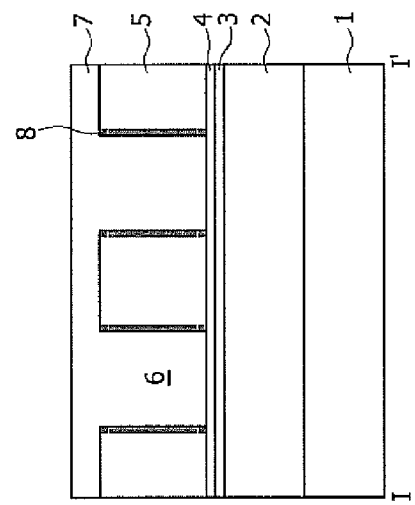

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIGS. 1a to 1f illustrate plan views of a semiconductor device and sectional views taken along line I-I' of the semiconductor device, which illustrate a method for fabricating the semiconductor device in accordance with an embodiment of the present invention. FIGS. 2a and 2b are scanning electron microscope (SEM) photographs corresponding to FIGS. 1a and 1e, respectively.

Figure 2A:
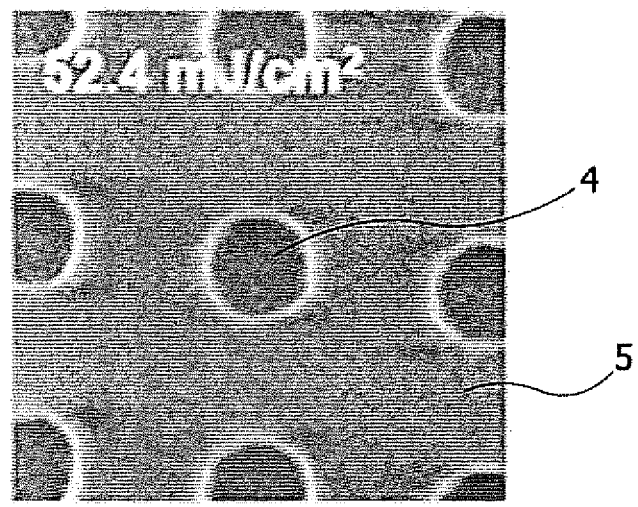
FIGS. 2a and 2b are scanning electron microscope (SEM) photographs corresponding to FIGS. 1a and 1e, respectively.
Figure 2B:
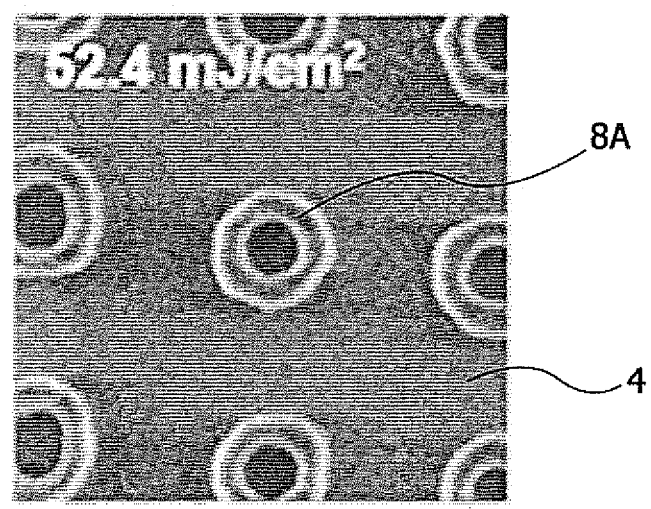

As illustrated in FIGS. 1a and 2a, a first layer 1, which is to be etched, an amorphous carbon layer 2, a silicon oxynitride (SiON) layer 3, an anti-reflection layer 4, and a first photoresist pattern 5 are formed on a substrate.

The first layer 1 may be a conducting layer or insulating layer. The first layer 1 may be a conducting layer for fabricating a cylinder-type capacitor or a conducting layer for fabricating a magnetic tunnel junction of a spin transfer torque random access memory (STTRAM) as occasion demands.

The amorphous carbon layer 2 is used to complement the ability of the first photoresist pattern 5 to be an etch barrier. More specifically, since etching the first layer 1 using only the first photoresist pattern 5 may be difficult, the amorphous carbon layer 2 is used to improve the ability of the first photoresist pattern 5 to be an etch barrier. The amorphous carbon layer 2 is a hard mask layer frequently used because the amorphous carbon layer 2 is easily removed and has a high etch selectivity with a thin film used as the first layer 1.

The SiON layer 3 is used as an etch barrier for etching the amorphous carbon layer 2. Since the etch selectivity between the first photoresist pattern 5 and the amorphous carbon layer 2 is low, etching the amorphous carbon layer 2 using the first photoresist pattern 5 as an etch barrier may be difficult. Thus, the SiON layer 3 is interposed between the first photoresist pattern 5 and the amorphous carbon layer 2.

The anti-reflection layer 4 is used to prevent reflection of a light source used when the first photoresist pattern 5 is formed. The anti-reflection layer 4 may be an organic layer, and the anti-reflection layer 4 is formed to have a thickness of 200 to 240 Å.

The first photoresist pattern 5 is used as an etch barrier for etching the anti-reflection layer 4, the SiON layer 3, the amorphous carbon layer 2, and the first layer 1. The first photoresist pattern 5 includes a plurality of holes 6. The holes 6 are formed by performing an exposure and development process on a photoresist material. More specifically, the holes 6 may have a width of 55 to 60 nm and are formed by coating an ArF immersion photoresist to have a thickness of 850 to 1100 Å, soft-baking the coated photoresist at a temperature of 95 to 115° C. for 50 to 70 seconds, and subsequently exposing the soft-baked photoresist using a light source such as 1.35NA dipole 35Y. In this embodiment, an H-group is disposed at a sidewall surface of the first photoresist pattern 5. The H-group is produced through a reaction between the photoresist material and the light source used in the process of exposing the photoresist material. As occasion demands, a top coating material having a thickness of 300 to 450 Å may be coated on the photoresist to protect the ArF immersion photoresist from moisture.

Figure 1B:
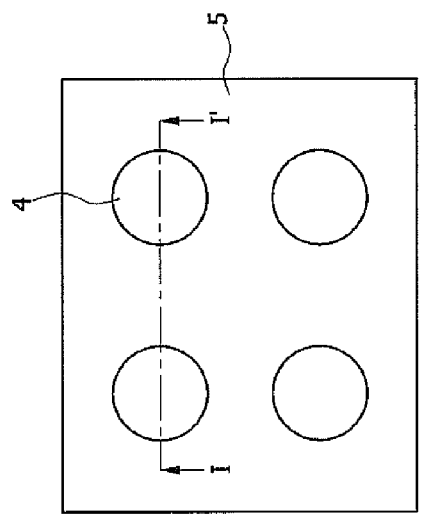
Figure 1B:
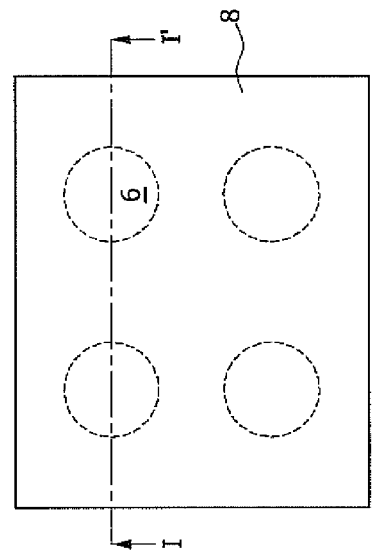

As illustrated in FIG. 1b, a surface curing layer 7 is coated on the first photoresist pattern 5 including the holes 6. Particularly, the surface curing layer 7 is filled inside of the hole 6.

The surface curing layer 7 is an aqueous solution having a surface curing agent (SCA) function. Since the surface curing layer 7 is an aqueous solution, the surface curing layer 7 is coated using a spin coating method. XL429 prepared by DOW may be used as an example of the surface curing layer 7.

If the surface curing layer 7 is filled in the hole 6, the sidewall surface of the photoresist pattern 5 is cured through a reaction between the surface curing layer 7 and the H-group disposed at the sidewall surface of the photoresist pattern 5. A baking process may be additionally performed so that the sidewall surface of the photoresist pattern 5 is more efficiently cured.

The surface curing layer 7 may also be coated on an upper surface of the first photoresist pattern 5. However, since the H-group is not disposed at the upper surface of first photoresist pattern 5, the upper surface of the first photoresist pattern 5 is not cured. The surface curing layer 7 is not cured on an upper surface of the surface curing layer 7 because the reaction between the light source and the upper surface of the first photoresist pattern 5 is prevented by a reticle in the process of exposing the first photoresist pattern 5.

Hereinafter, for illustration purposes, the cured first photoresist pattern 5 is referred to as a first curing pattern 8.

Figure 1C:
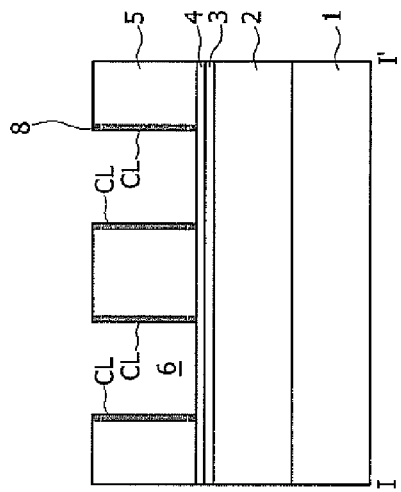
Figure 1C:
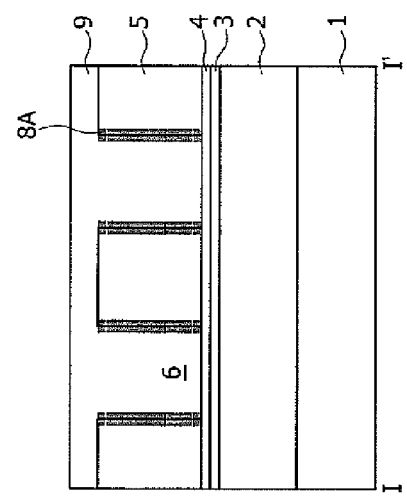

As illustrated in FIG. 1c, the surface curing layer 7 is removed.

The surface curing layer 7 is removed using a developing device. In this embodiment, a cross linker CL is absorbed in the first photoresist pattern 5 at the sidewall of the first photoresist pattern 5 while being diffused. The cross linker CL means that a part of the surface curing layer 7 remains. The cross linker CL is also produced by the H-group.

Figure 1D:
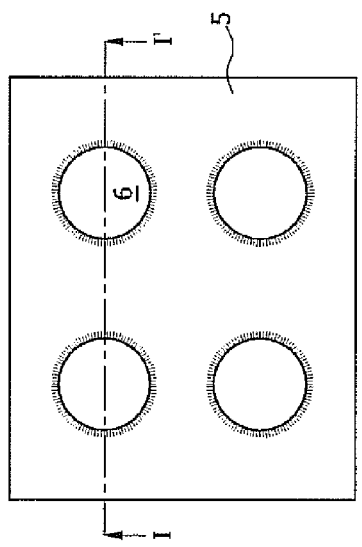
Figure 1D:
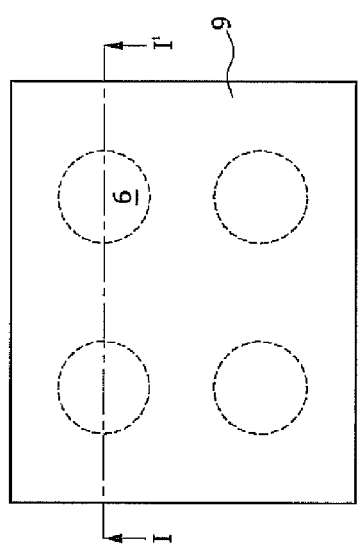

As illustrated in FIG. 1d, a second photoresist 9 is coated on the first photoresist pattern 5 and in the holes 6.

The second photoresist 9 is formed by coating an ArF immersion photoresist to have a thickness of 850 to 1100 Å and subsequently soft-baking the coated photoresist at a temperature of 95 to 115° C. for 50 to 70 seconds. As occasion demands, a top coating material having a thickness of 300 to 450 Å may be coated on the second photoresist 9 to protect the second photoresist 9 from moisture.

If the second photoresist 9 is coated as described above, the cross linker CL is diffused in the second photoresist 9 so that the second photoresist 9 is cured. Since the cross linker CL is distributed on a surface of the first curing pattern 8, a portion of the second photoresist 9 that contacts with the curing pattern 8 is cured, but a portion of the second photoresist pattern 9 not that does not contact the first curing pattern 8 is not cured. Hereinafter, for illustration purposes, the cured second photoresist pattern 9 and the curing pattern 8 are referred to as a curing pattern 8A.

Figure 1E:
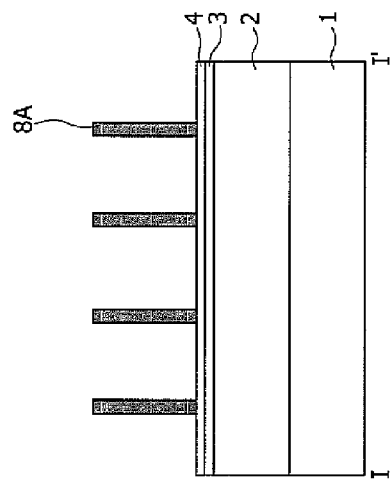
Figure 1E:
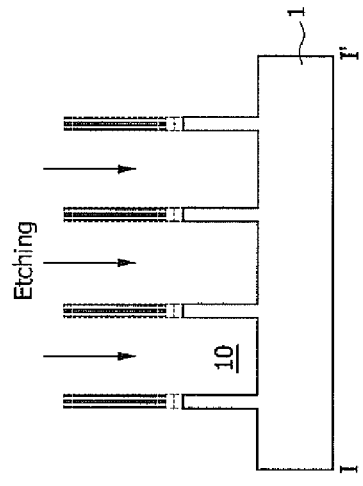

As illustrated in FIGS. 1e and 2b, the uncured first photoresist pattern 5 and second photoresist 9 are removed.

The uncured first photoresist pattern 5 and second photoresist 9 is removed through exposure and development. The exposure is performed using an ArF dry or immersion scanner. The exposure is performed using a flood exposure method without a reticle. The width of the curing pattern 8A depends on an exposure time. If the exposure time is long, a part of the curing pattern 8A is removed, and the width of the curing pattern 8A is narrowed. On the contrary, if the exposure time is short, the width of the curing pattern 8A is widened. Thus, the thickness of the curing pattern 8A is adjusted by controlling the exposure time. After the exposure is performed, a post exposure bake (PEB) process is performed at a temperature of 90 to 120° C. When the PEB process is performed, the width of the curing pattern 8A may be adjusted by changing a temperature condition. Subsequently, the exposed photoresists 5 and 9 are developed using a developer TMAH of 2.38 wt %.

Figure 1F:
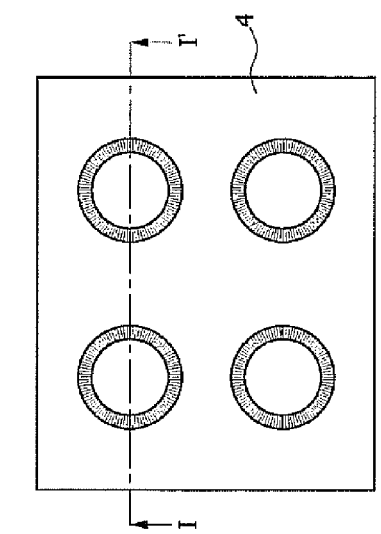
Figure 1F:
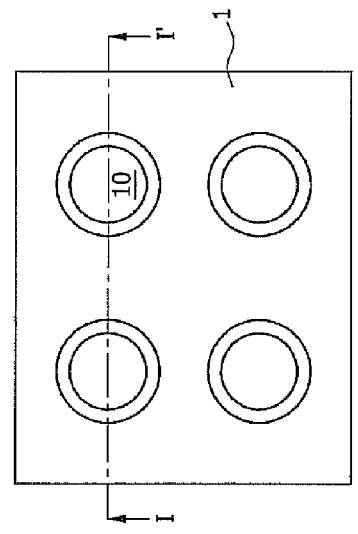

As illustrated in FIG. 1f, the anti-reflection layer 4, the SiON layer 3, the amorphous carbon layer 2 and the first layer 1 are etched using the curing pattern 8 as an etch barrier. Accordingly, a ring pattern 10 is formed on the first layer 1.

As described above, in the method for fabricating the semiconductor device in accordance with the embodiment of the present invention, the photoresist pattern is patterned (cured) in a spacer form, and the first layer 1 is etched using the patterned photoresist pattern as an etch barrier.

The conventional double patterning technology and spacer patterning technology have high cost, long process time, and complicated processes. Moreover, the spacer patterning process is further complicated because a process of depositing and etching a spacer thin film is necessarily performed. However, since the photoresist can be coated using a spin coating method and a separate etching process may not be performed, processes are simplified. Since the photoresist has low cost and short patterning time, the photoresist is more advantageous than the conventional spacer thin film. In the conventional spacer patterning technology, the width of a spacer may be difficult to control. However, the photoresist can control the width of the curing pattern 8A by changing the exposing time and temperature condition of the PEP. While the conventional spacer patterning technology requires a separate process for removing the spacer, the present invention using the photoresist does not require the separate process for removing the spacer, and hence processes are simplified. In accordance with the embodiment of the present invention, since using a device for depositing and patterning the spacer thin film is not included, fabrication cost may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:

forming a first photoresist pattern having a hole on a first layer;

forming a surface curing layer in the hole and curing the first photoresist pattern on an inner sidewall of the hole to form a first curing pattern;

removing the surface curing layer;

forming a second photoresist pattern in the hole and curing the second photoresist pattern that contacts with the first curing pattern to form a second curing pattern;

removing the first and second photoresist pattern; and etching the first layer using the first and second curing patterns as an etch barrier.

2. The method of claim 1, wherein the hole is formed by selectively exposing and developing the first photoresist pattern.

3. The method of claim 1, wherein the surface curing layer is an aqueous solution having a surface curing agent (SCA) function.

4. The method of claim 1, wherein the removing of the surface curing layer is performed through development.

5. The method of claim 1, wherein the removing of the first and second photoresist pattern is performed through exposure and development.

6. The method of claim 5, wherein the exposure is performed using a flood exposure method without a reticle.

7. The method of claim 5, wherein the widths of the first and second curing patterns are controlled by an exposure time for removing the first and second photoresist patterns.

8. The method of claim 5, further comprising performing post exposure bake (PEB) after performing the exposure for removing the first and second photoresist patterns.

9. The method of claim 8, wherein the widths of the first and second curing patterns are controlled by a temperature condition of the PEB.

10. The method of claim 1, wherein the widths of the first and second curing patterns are controlled by a temperature condition of the PEB and an exposure process for removing the first and second photoresist patterns.

11. The method of claim 9, the temperature condition of the PEB includes a temperature between 90 and 120° C.

12. The method of claim 10, the temperature condition of the PEB includes a temperature between 90 and 120° C.

13. The method of claim 1, further comprising disposing a material at a sidewall surface of the first photoresist pattern in the hole that is produced through a reaction between the first photoresist pattern and a light source used to expose the first photoresist pattern.

14. The method of claim 1, wherein a portion of the surface curing layer is absorbed in the first photoresist pattern at an inner sidewall.

15. The method of claim 14, wherein the portion of the surface curing layer absorbed in the first photoresist material at an inner sidewall is diffused in the second photoresist material when the second photoresist pattern is formed.

* * * * *